United States Patent
Yoshiyama et al.

(10) Patent No.: US 6,620,666 B2
(45) Date of Patent: Sep. 16, 2003

(54) METHOD OF MANUFACTURING SEMICONDUCTOR DEVICE OF DUAL-GATE CONSTRUCTION, AND SEMICONDUCTOR DEVICE MANUFACTURED THEREBY INCLUDING FORMING A REGION OF OVER-LAPPING N-TYPE AND P-TYPE IMPURITIES WITH LOWER RESISTANCE

(75) Inventors: Kenji Yoshiyama, Tokyo (JP); Keiichi Higashitani, Tokyo (JP); Masao Sugiyama, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 74 days.

(21) Appl. No.: 09/766,844

(22) Filed: Jan. 23, 2001

(65) Prior Publication Data

US 2002/0025663 A1 Feb. 28, 2002

(30) Foreign Application Priority Data

Aug. 28, 2000 (JP) ........................................ 2000-256605

(51) Int. Cl.⁷ ...................... H01L 21/337; H01L 21/425
(52) U.S. Cl. ........................ 438/195; 438/516; 438/527
(58) Field of Search ................................. 438/159, 195, 438/516, 527, 556

(56) References Cited

U.S. PATENT DOCUMENTS 5,449,637 A * 9/1995 Saito et al. .................. 438/227
5,998,848 A * 12/1999 Brown et al. ................ 257/407

FOREIGN PATENT DOCUMENTS

| JP | 62-160767 | 7/1987 |
| JP | 9-289257 | 11/1997 |

OTHER PUBLICATIONS

Stanley Wolf Ph.D. in Silicon Processing for the VLSI Era, vol. 2: Process Integration, Lattice Press, 1990, pp. 144–147.*

* cited by examiner

Primary Examiner—Olik Chaudhuri
Assistant Examiner—William M. Brewster
(74) Attorney, Agent, or Firm—McDermott, Will & Emery

(57) ABSTRACT

There is described a method of manufacturing a semiconductor device of dual-gate construction, which method prevents occurrence of a highly-resistant local area in a gate electrode of dual-gate construction. A polysilicon layer which is to become a conductive layer of a gate electrode of dual-gate construction is formed on an isolation oxide film. N-type impurities are implanted into an n-type implantation region of the polysilicon film while a photoresist film is taken as a mask. P-type impurities are implanted into a p-type impurity region of the polysilicon film 3 while another photoresist film is taken as a mask. Implantation of n-type impurities and implantation of p-type impurities are performed such that an overlapping area to be doped with these impurities in an overlapping manner is inevitably formed.

2 Claims, 5 Drawing Sheets

METHOD OF MANUFACTURING SEMICONDUCTOR DEVICE OF DUAL-GATE CONSTRUCTION, AND SEMICONDUCTOR DEVICE MANUFACTURED THEREBY INCLUDING FORMING A REGION OF OVER-LAPPING N-TYPE AND P-TYPE IMPURITIES WITH LOWER RESISTANCE

BACKGROUND OF THE INVENTION

1. Field of the Invention

The present invention relates to a method of manufacturing a semiconductor device of dual gate construction, as well as to a semiconductor device manufactured thereby.

2. Description of the Background Art

In the field of semiconductor devices such as memory devices or logic devices, there have widely been used complementary MOS (CMOS) transistors, each comprising an n-type MOS (NMOS) transistor and a p-type MOS (PMOS) transistor fabricated in a single substrate. In such a CMOS transistor, an area which acts as the gate electrode of an NMOS transistor is arranged so as to become an n-type semiconductor, and an area which acts as the gate electrode of a PMOS transistor is arranged so as to become a p-type semiconductor.

FIGS. 4A to 4D are enlarged cross-sectional views showing a portion of a conventional semiconductor device of dual-gate construction. As shown in FIG. 4A, reference numeral 1 designates a silicon substrate; 2 designates an isolation oxide film; and 3 designates a polysilicon film. In the silicon substrate 1, an active region to be used for fabricating an NMOS transistor and an active region to be used for fabricating a PMOS transistor are formed at both the left side and the right side of the isolation oxide film 2 shown in FIGS. 4A through 4D, although not being illustrated. Within the respective active regions, the polysilicon films 3 are stacked on unillustrated gate insulating films. The polysilicon film 3 is to become a conductive layer of a gate electrode of dual-gate construction. The polysilicon film 3 is divided into an n-type implantation region which is to act as a gate electrode of an NMOS transistor, and a p-type implantation region which is to act as a gate electrode of a PMOS transistor.

FIG. 4A shows the silicon substrate 1 having formed thereon the gate dielectric film and the non-doped polysilicon film 3 when the silicon substrate 1 has been doped for forming a lightly-doped n-type source-drain region and doped for forming a lightly-doped p-type source-drain region. As a result of the silicon substrate 1 being doped, n-type impurities are implanted into the n-type implantation region of the polysilicon film 3, and p-type impurities are implanted into the p-type implantation region of the same.

A sidewall for covering the side surface of the polysilicon film 3 is formed on the surface of the silicon substrate 1 in order to impart a lightly-doped drain (LLD) construction to the NMOS transistor and the PMOS transistor. As shown in FIG. 4B, while a photoresist film 4 covering the p-type implantation region is taken as a mask, impurities are introduced for forming a highly-doped n-type source-drain region.

As shown in FIG. 4C, while a photoresist film 5 covering the n-type implantation region is taken as a mask, impurities are implanted for forming a highly-doped p-type source-drain region. As a result, a highly-doped p-type region 6 containing p-type impurities at high concentration and a highly-doped n-type region 7 containing n-type impurities at high concentration are formed within the polysilicon film 3.

Subsequently, as shown in FIG. 4D, a silicide film 8 is formed on the surface of the highly-doped p-type region 6 and the surface of the highly-doped n-type region 7, in order to decrease the resistance of the gate electrode.

FIGS. 5A to 5d are illustrations for describing a drawback of the above-described conventional method for manufacturing a semiconductor device. As shown in FIGS. 4B and 4C, according to the conventional method, the highly-doped n-type region 7 is formed while the photoresist film 4 is taken as a mask, and the highly-doped p-type region 6 is formed while the photoresist film 5 is taken as a mask. In this case, a gap or overlap may arise between the highly-doped p-type region 6 and the highly-doped n-type region 7 for reasons of an error in the overlay accuracy or dimensional accuracy of a mask used in a photolithography operation.

FIG. 5A shows that the lightly-doped polysilicon film 3 is left in a position between the highly-doped p-type region 6 and the highly-doped n-type region 7 for reasons of an error in the overlay accuracy or dimensional accuracy of a mask. FIG. 5B shows that an overlap arises in a position between the highly-doped p-type region 6 and the highly-doped n-type region 7 for reasons of an error in the overlay accuracy or dimensional accuracy of a mask.

In a case where the silicide film 8 is appropriately formed over the entire surface of the gate electrode as shown in FIGS. 5A and 5B, the resistance of the gate electrode is essentially determined by the silicide film 8 without regard to existence of the lightly-doped polysilicon film 3 or the overlapping area 9. In such a case, an error in the overlay accuracy or dimensional accuracy of a mask does not pose any problem in the characteristic of a semiconductor device.

The silicide film 8 is more likely to be formed in a highly-doped area than in an area of a lightly-doped polysilicon film or in a non-doped area produced by a mask stacking error during formation of a low-concentration region. Such a phenomenon tends to become more noticeable as the pattern of a gate electrode becomes more minute. Even in a case where dust particles are present on the surface of a gate electrode before formation of the silicide film 8, the silicide film 8 will not be formed in the area where the dust particles are present. FIG. 5C shows that no silicide film 8 is formed on the lightly-doped polysilicon film 3, because of the properties of the silicide film 8. FIG. 5D shows that no silicide film 8 is formed in an overlapping area 9 between an n-type region and a p-type region, because the overlapping area 9 is lightly doped as a result of carriers canceling each other.

In these cases, a high-resistance area arises in a gate electrode, which in turn deteriorates the characteristic of a semiconductor device. Conceivably, in the future the interconnection width of a gate electrode will become smaller as miniaturization of a semiconductor device progresses. Therefore, a highly-resistant portion locally arising in a gate electrode poses a greater problem.

SUMMARY OF THE INVENTION

The present invention has been conceived to solve such a drawback of the background art and is aimed at providing a method of manufacturing a semiconductor device which prevents a highly-resistant portion from locally arising in a gate electrode of dual-gate construction.

The present invention is also aimed at providing a semiconductor device manufactured by the method.

The above objects of the present invention are achieved by a method of manufacturing a semiconductor device having a gate electrode of dual-gate construction. In the method, there is formed a silicon film which is to act as a conductive layer of the gate electrode. N-type impurities are implanted into a first region of the silicon film. P-type impurities are implanted into a second region of the silicon film. A silicide film is formed on the surface of the silicon film doped with the impurities. Implantation of the n-type impurities and implantation of the p-type impurities are performed such that an overlapping region is inevitably formed between the first and second regions.

The above objects of the present invention are also achieved by a semiconductor device which has a gate electrode of dual-gate construction and is manufactured by the methods described above.

Other objects and further features of the present invention will be apparent from the following detailed description when read in conjunction with the accompanying drawings.

DESCRIPTION OF THE PREFERRED EMBODIMENTS

Figure 1A:
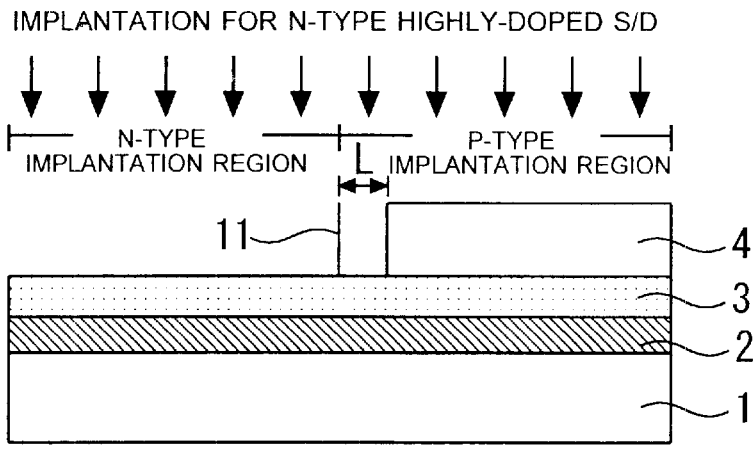
FIGS. 1A through 1C are cross-sectional views for describing a method for manufacturing a semiconductor device according to a first embodiment of the present invention.

Preferred embodiments of the present invention will be described hereinbelow by reference to the accompanying drawings. Elements common to the drawings are assigned the same reference numerals, and repetition of their explanations is omitted.

First Embodiment

Figure 1B:
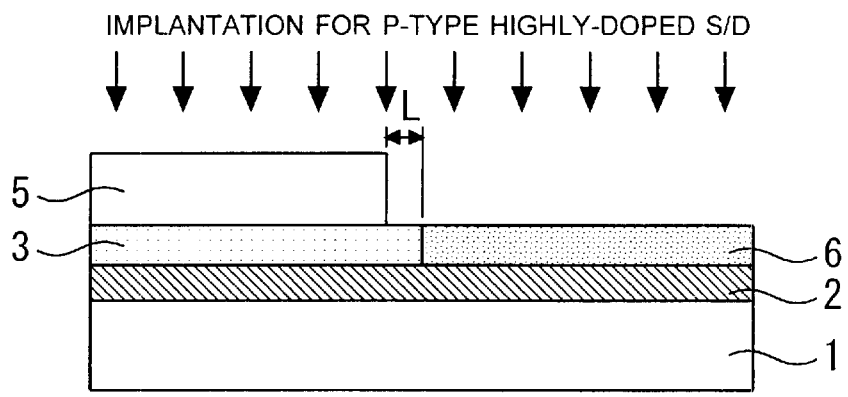
Figure 1C:
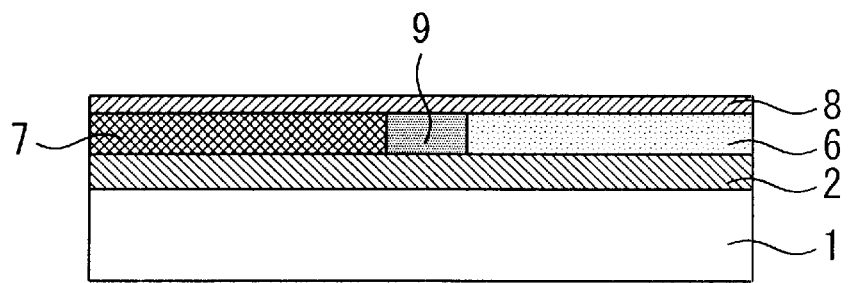

FIGS. 1A to 1C are enlarged cross-sectional views showing a portion of a semiconductor device of dual-gate construction manufactured by a method according to a first embodiment of the present invention. In FIG. 1A, reference numeral 1 designates a silicon substrate; 2 designates an isolation oxide film; and 3 designates a polysilicon film. In the silicon substrate 1, an active region to be used for fabricating an NMOS transistor and an active region to be used for fabricating a PMOS transistor are formed at both the left side and the right side of the isolation oxide film 2 shown in FIGS. 1A through 1C, although not being illustrated.

The polysilicon film 3 is to become a conductive layer of a gate electrode of dual-gate construction. A substantial center of the substrate 1 in the longitudinal direction thereof shown in FIG. 1A is taken as a boundary area 11, and an n-type implantation region which is to act as a gate electrode of an NMOS transistor is formed on the left of the boundary area 11. A p-type implantation region which is to act as a gate electrode of a PMOS transistor is formed on the right of the boundary area 11. FIG. 1A shows a state in which, after the gate insulating film and the non-doped polysilicon film 3 have been formed on the semiconductor substrate 1, impurities are implanted for forming an n-type low-concentration source-drain region and forming a p-type low-concentration source-drain region. As a result of the silicon substrate 1 being doped, n-type impurities are implanted into the n-type implantation region of the polysilicon 3, and p-type impurities are implanted into the p-type implantation region of the same.

Sidewalls (not shown) for covering the side surface of the polysilicon film 3 is formed on the surface of the silicon substrate 1 in order to impart a lightly-doped drain (LDD) construction to the NMOS transistor and the PMOS transistor. As shown in FIG. 1A, while a photoresist film 4 covering the p-type implantation region is taken as a mask, impurities are implanted for forming a highly-doped n-type source-drain region.

In the present embodiment, the photoresist film 4 used for implanting impurities is patterned such that the end face of the photoresist mask 4 covering the surface of the polysilicon film 3 is spaced a predetermined distance L away from the boundary area 11 between the n-type implantation region and the p-type implantation region. Here, the predetermined distance L corresponds to a maximum value of error which would arise in the photoresist 4 for reasons of an error in the overlay accuracy or dimensional accuracy of a mask used in a photolithography process. Since the photoresist film 4 is patterned in this way, n-type impurities can be implanted into the entire area of the n-type implantation region without regard to the overlay accuracy or dimensional accuracy of a mask.

As shown in FIG. 1B, impurities are implanted for producing a highly-doped p-type source-drain region while the photoresist film 5 covering the n-type implantation region is taken as a mask. In the present embodiment, the photoresist film 5 used for doping is patterned such that the end face of the photoresist film 5 is spaced a predetermined distance L away from the boundary area 11, as is the photoresist film 4. Accordingly, in the present embodiment, p-type impurities can be implanted at high concentration to the entire area of the p-type implantation region without regard to the overlay accuracy or dimensional accuracy of a mask.

FIG. 1C shows that an overlapping area 9 containing p-type impurities and n-type impurities at high concentrations is formed between the highly-doped p-type region 6 and the highly-doped n-type region 7. In order to reduce the resistance of a gate electrode, a silicide film 8 is formed over the surface of the highly-doped n-type region 7, the surface of the highly-doped p-type region 6, and the surface of the overlapping area 9.

Under the method according to the present invention, while the overlapping area 9 may be formed between the highly-doped p-type region 6 and the highly-doped n-type region 7, a lightly-doped area is never formed at that position. More specifically, the method according to the present invention unfailingly prevents remaining, on the surface of the polysilicon film 3 serving as a conductive layer of the gate electrode, of an area in which the silicide film 8 is less likely to be formed. According to the present embodiment, there can be effectively prevented formation of a highly-resistant local area in a gate electrode of dual-gate construction.

Second Embodiment

A second embodiment of the present invention will now be described by reference to FIGS. 2A through 2C. In the first embodiment, the overlapping region 9 is formed intentionally between the highly-doped p-type region 6 and the highly-doped n-type region 7, thereby preventing formation of a lightly-doped area. In a case where the overlapping area 9 is doped with the n-type impurities and the p-type impurities at substantially the same concentration, carriers will cancel each other, wherewith the overlapping area 9 may exhibit high resistance, as is a lightly-doped area.

Under circumstances where the overlapping area 9 exhibits high resistance, if the influence of dust particles prevents formation of the silicide film 8 on the overlapping area 9, a highly-resistant area may locally appear in a gate electrode. In the present embodiment, a gate electrode of a dual gate construction is formed according to the following procedures in order to overcome the above-mentioned problem.

Figure 2A:
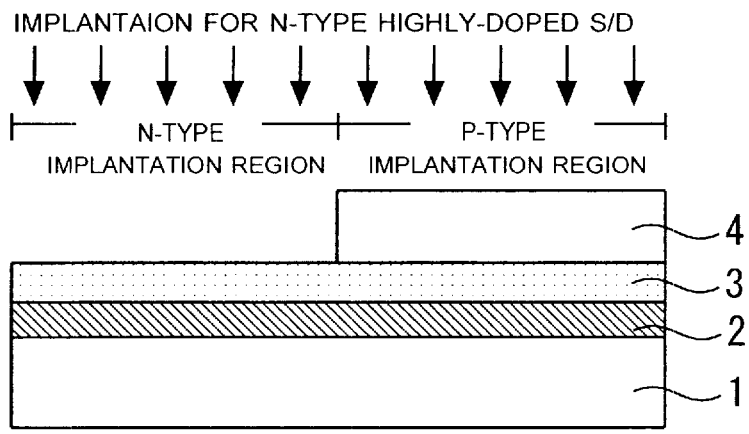
FIGS. 2A through 2C are cross-sectional views for describing a method for manufacturing a semiconductor device according to a second embodiment of the present invention.

FIG. 2A shows implantation of impurities for producing an n-type source-drain region while the photoresist film 4 is taken as a mask. As a result of an operation of the implantation, the n-type implantation region of the polysilicon film 3 is doped with n-type impurities at high concentration, thereby forming the highly-doped n-type region 7. In this phase, n-type impurities are implanted at a concentration higher than that of p-type impurities to be implanted in a subsequent process; more specifically, at a concentration which would cause a difference of $1 \times 10^{15}/cm^2$ or more between the concentration of n-type impurities and the concentration of p-type impurities.

Figure 2B:
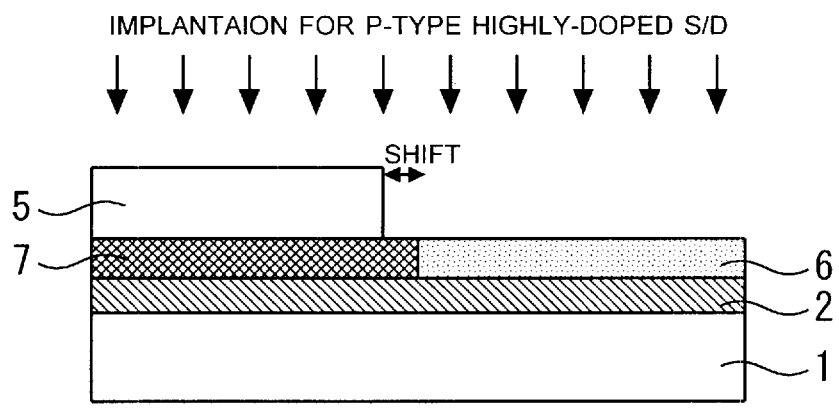

As shown in FIG. 2B, impurities are implanted for producing a highly-doped p-type source-drain region while the photoresist mask 5 covering the n-type implantation region is taken as a mask. At this time, the photoresist film 5 is patterned such that the end face of the photoresist film 5 is shifted toward the center thereof (i.e., in the leftward direction as shown in FIG. 2B) with reference to the end face of the highly-doped n-type region 7 (i.e., the end face shown on the right side as shown in FIG. 2B). More specifically, the photoresist film 5 is patterned such that the end face does not enter the p-type implantation region, without regard to an error in the overlay accuracy or dimensional accuracy of a mask.

Figure 2C:
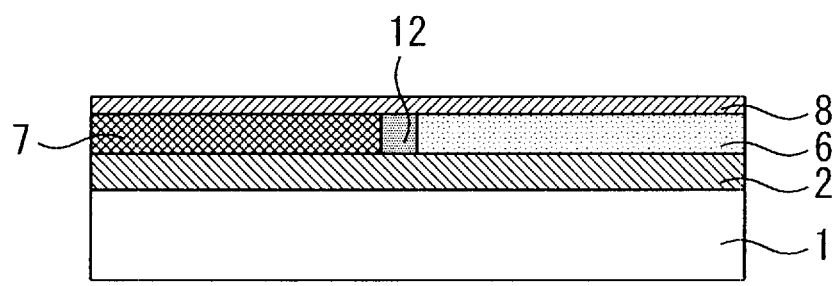

As a result, As shown in FIG. 2C, an overlapping area 12 in which n-type impurities are doped at a higher concentration than are p-type impurities is formed between the highly-doped p-type region 6 and the highly-doped n-type region 7. In this case, the overlapping area 12 serves as an n-type semiconductor doped with n-type impurities at high concentration and exhibits low resistance. Thus, even in a case where the silicide film 8 is not appropriately formed on the overlapping area 12, the present embodiment enables manufacture of a semiconductor device having a stable characteristic.

In the second embodiment, after n-type impurities have been implanted into the n-type implantation region at high concentration, p-type impurities are implanted into the p-type implantation region. A doping sequence is not limited to such an example. Hence, n-type impurities may be implanted at high concentration into the n-type implantation region after implantation of p-type impurities into the p-type implantation region at high concentration.

In the present embodiment, n-type impurities are set so as to become higher in concentration than p-type impurities. The present invention is not limited to such a proportion of impurities. More specifically, p-type impurities may be set so as to become higher in concentration than n-type impurities.

Third Embodiment

A third embodiment of the present invention will now be described by reference to FIG. 3. In the second embodiment, n-type impurities to be implanted into the highly-doped n-type source-drain region are set higher in concentration than are p-type impurities to be implanted into the highly-doped p-type source-drain region, thereby reducing the resistance of the overlapping area 9.

However, the concentration of impurities to be implanted into a source-drain region is an important factor which determines the characteristic of a transistor. Hence, satisfying the required characteristics of a transistor may pose difficulty in setting concentration of impurities, as mentioned in connection with the second embodiment. In the present embodiment, in order to solve this problem, the gate electrode of a dual-gate construction is formed according to the following procedures.

Figure 3A:
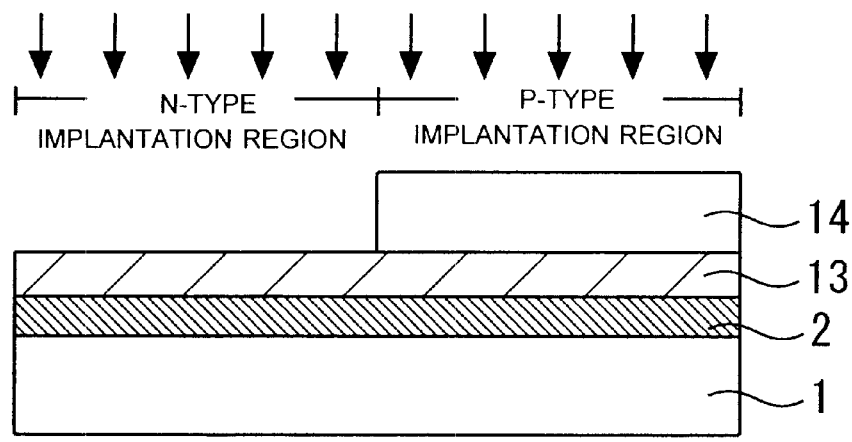
FIGS. 3A and 3B are cross-sectional views for describing a method for manufacturing a semiconductor device according to a third embodiment of the present invention.

As shown in FIG. 3A, under the method according to the present embodiment, the non-doped polysilicon film 13 is formed on the isolation oxide film 2. Next, n-type impurities are preliminarily implanted at a predetermined dose (for example, a dose of $4 \times 10^{15}/cm^2$) while a photoresist film 14 to be used for doping the highly-doped n-type source-drain region with impurities is taken as a mask. Implantation of n-type impurities performed in this phase usually has a smaller effect on the characteristic of a transistor than does implantation of impurities in the source-drain region.

Figure 3B:
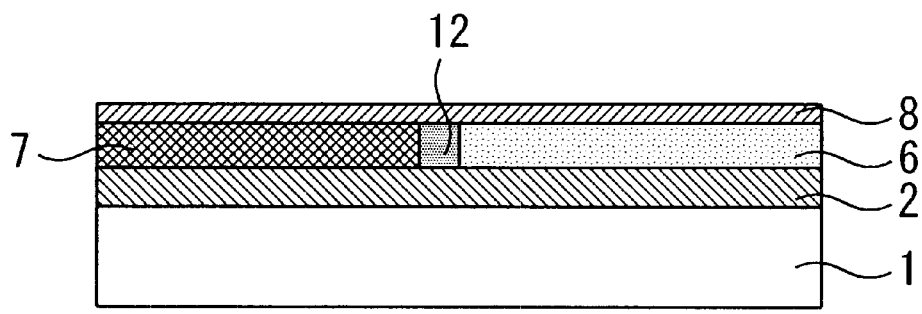
Figure 4A:
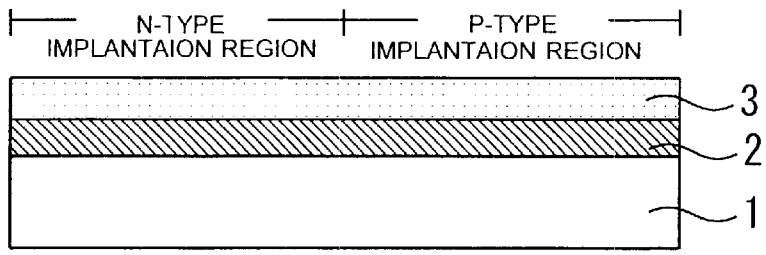
FIGS. 4A through 4D are cross-sectional views for describing a conventional method for manufacturing a semiconductor device.
Figure 4B:
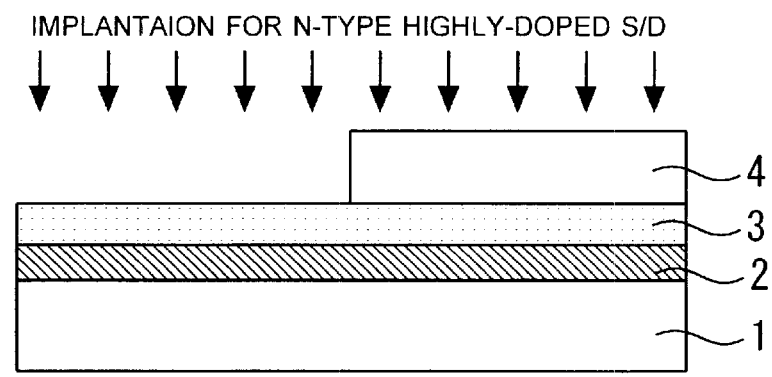
Figure 4C:
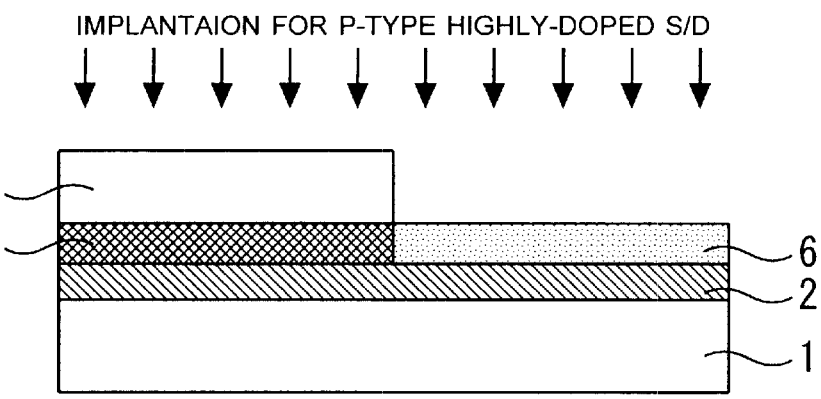
Figure 4D:
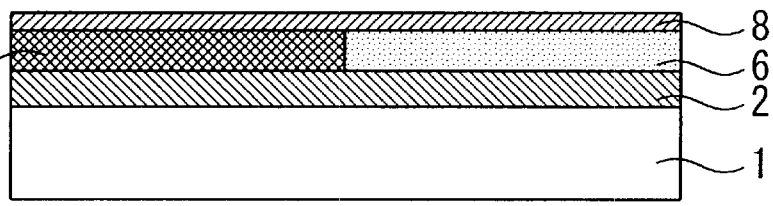
Figure 5A:
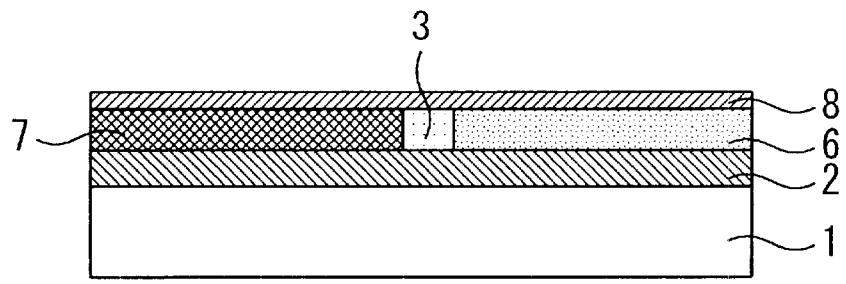
FIGS. 5A through 5D are cross-sectional views for describing problems of the conventional method for manufacturing a semiconductor device.
Figure 5B:
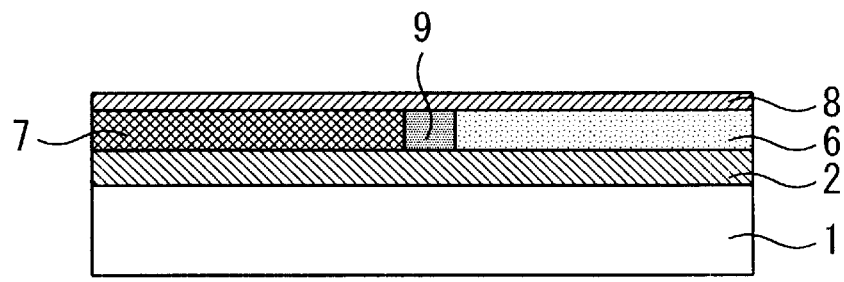
Figure 5C:
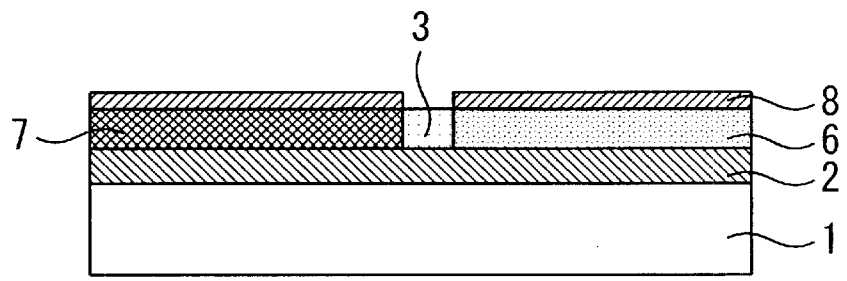
Figure 5D:
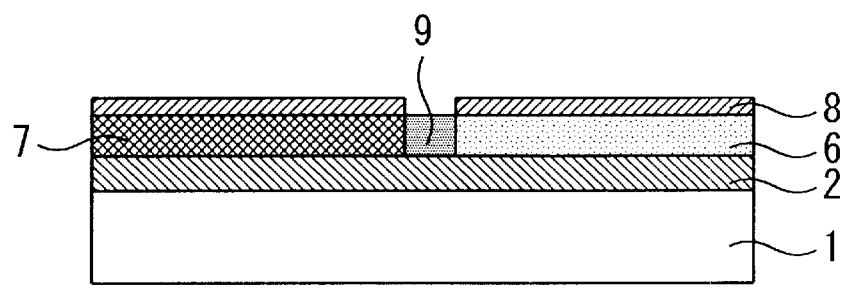

Subsequently, there are performed implantation of n-type impurities for producing a highly-doped n-type source-drain region and implantation of p-type impurities for producing a highly-doped p-type source-drain region. Implantation of impurities is performed in the same manner as in the second embodiment, except that n-type impurities and p-type impurities are implanted at the same concentration to the n-type implantation region and the p-type implantation region, respectively. As a result, there is formed on the isolation oxide film 2 the overlapping area 12 as well as the p-type high-concentration region 6 and the n-type high-concentration region 7 between which the overlapping area 12 is formed as shown in FIG. 3B.

In the present embodiment, n-type impurities are preliminarily implanted into only the n-type implantation region before implantation of impurities into the highly-doped n-type source-drain region and the highly-doped p-type source-drain region. Therefore, even if impurities are implanted at the same concentration into the highly-doped n-type region and the highly-doped p-type region, the overlapping area 12 is doped with n-type impurities at higher concentration than with p-type impurities. Accordingly, the manufacturing method according to the present embodiment enables implementation of the same dual-gate construction as that implemented in the second embodiment.

Even when the patterning operation shown in FIG. 3A is performed through use of, for example, a mask to be used for producing a p-type well region, there can be yielded the same advantage as that yielded when a mask for forming an n-type source-drain region is used. In this case, the mask to be used for producing a p-type well region differs in pattern from the mask used for producing an n-type source-drain region, there is the same or less probability of occurrence of a lightly-doped region in a gate electrode.

In the third embodiment, only the n-type implantation region is preliminarily doped with impurities, thereby reducing the resistance of the overlapping area 12. However, the present invention is not limited to such an embodiment. The only requirement is that preliminary implantation of impurities be performed so as to induce a difference between the concentration of the n-type implantation region and that of the p-type implantation region. Alternatively, implantation of impurities may be performed so as to induce the doping level of the p-type implantation region to become higher than the doping level of the n-type implantation region.

Since the present invention has been embodied in the manner as mentioned previously, the following advantages are yielded.

First, the present invention prevents formation of a lightly-doped region in a conductive layer of a gate electrode of dual-gate construction without fail. A silicide film is less likely formed on a lightly-doped area. In order to prevent formation of the lightly-doped area, the present invention enables appropriate formation of a silicide film over the entire surface of the gate electrode. Accordingly, the present invention enables implementation of a semiconductor device having a gate electrode of dual-gate construction which exhibits low resistance over the entire surface thereof.

Second, the present invention enables extension of a region to be doped with n-type impurities toward a second region side from a predetermined boundary line, by means of implanting n-type impurities through use of a first mask. Further, the present invention enables extension of a region to be doped with p-type impurities toward a first region side from the predetermined boundary line, by means of implanting p-type impurities through use of a second mask. In other words, the present invention enables formation of an overlapping area in a region including the boundary line without fail, thereby reliably preventing remaining of a lightly-doped area in a silicon film.

Third, the present invention enables setting of impurities such that n-type impurities and p-type impurities differ in concentration. In this case, n-type impurities and p-type impurities do not cancel each other completely in the overlapping area, and hence even the overlapping area can attain low resistance.

Fourth, according to the present invention, implantation of n-type impurities and p-type impurities is performed in conjunction with implantation of impurities into a source-drain region. According to the present invention, impurities are preliminarily implanted into only either the first or second region. Therefore, while the first region and the second region are being doped with impurities at the same concentration during implantation of impurities into a source-drain region, the resistance of an overlapping area can be reduced. Thus, even under circumstances where the degree of freedom of doping level is limited, the present invention enables a reduction in resistance of the gate electrode over the entire area thereof.

Fifth, the present invention enables manufacture of a semiconductor device having a stable characteristic through use of the method described above.

Further, the present invention is not limited to these embodiments, but variations and modifications maybe made without departing from the scope of the present invention.

The entire disclosure of Japanese Patent Application No. 2000-256605 filed on Aug. 28, 2000 including specification, claims, drawings and summary are incorporated herein by reference in its entirety.

What is claimed is:

1. A method of manufacturing a semiconductor device having a gate electrode of dual-gate construction comprising an area acting as a gate electrode of an N-channel MOS transistor and an area acting as a gate electrode of a P-channel MOS transistor, the method comprising the steps of:

forming a silicon film which is to act as a conductive layer of the gate electrode;

forming a first mask having an aperture in a first region of the silicon film;

implanting n-type impurities into the first region of the silicon film from above the first mask;

fanning a second mask having an aperture in a second region of the silicon film;

implanting p-type impurities into the second region of the silicon film from above the second mask;

wherein the first mask is positioned such that the end face of the aperture is spaced away from a predetermined boundary line toward the center of the second region, by a distance equal to the highest possible value of an error, and wherein the second mask is positioned such that the end face of the aperture is spaced away from the boundary line toward the center of the first region, by a distance equal to the highest possible value of an error; and forming a silicide film on the surface of the silicon film doped with the impurities;

wherein implantation of the n-type impurities and implantation of the p-type impurities are performed such that an overlapping region is inevitably fanned between the first and second regions, and the n-type and p-type impurities are implanted such that the concentrations of the n-type or p-type impurities differ by a predetermined level, thereby reducing the resistance of the overlapping region.

2. The method according to claim 1, wherein the step for implanting n-type impurities into the first region is performed simultaneously with implantation of n-type impurities into an area where a highly-doped n-type source-drain region is to be formed;

the step for implanting p-type impurities into the second region is performed simultaneously with implantation of p-type impurities into an area where a highly-doped p-type source-drain region is to be formed; and the method further comprises a step of preliminarily implanting n-type or p-type impurities into only one of the first and second regions.

* * * * *